United States Patent
Neal et al.

(10) Patent No.: US 8,704,509 B2
(45) Date of Patent: Apr. 22, 2014

(54) COMPACT ELECTRICAL POWER METER

(75) Inventors: Stanley Dale Neal, Mount Juliet, TN (US); David Randall Greer, Jr., Charlotte, TN (US); Donovan Eugene Wilkerson, Nolensville, TN (US)

(73) Assignee: Schneider Electric USA, Inc., Palatine, IL (US)

( * ) Notice: Subject to any disclaimer, the term of this patent is extended or adjusted under 35 U.S.C. 154(b) by 705 days.

(21) Appl. No.: 12/878,122

(22) Filed: Sep. 9, 2010

(65) Prior Publication Data

US 2012/0062211 A1 Mar. 15, 2012

(51) Int. Cl.
*G01R 15/18* (2006.01)

(52) U.S. Cl.
USPC .......................................................... 324/127

(58) Field of Classification Search
None
See application file for complete search history.

(56) References Cited

U.S. PATENT DOCUMENTS

| | | | |
|---|---|---|---|
| 8,116,072 B2 * | 2/2012 | Kagan et al. | 361/664 |
| 2003/0132742 A1 | 7/2003 | Harding et al. | 324/110 |
| 2004/0128085 A1 * | 7/2004 | Ramirez | 702/62 |
| 2006/0120028 A1 | 6/2006 | Kagan et al. | 361/659 |
| 2006/0258204 A1 * | 11/2006 | Preuhs et al. | 439/517 |
| 2009/0267466 A1 * | 10/2009 | Zook et al. | 312/223.6 |

OTHER PUBLICATIONS

Schneider Electric: Gain Energy Insight and Control With Power Logic "Power Logic PM800 Power and Energy Meters", dated Nov. 2008.
Schneider Electric: Gain Energy Insight and Control With Power Logic "*Power Logic ION6200 Power and Energy Meters*", dated Jan. 2010.
Schneider Electric: Gain Energy Insight and Control With Power Logic "Power Logic PM700 Power and Energy Meters", dated Nov. 2008.
Anonymous. "Square D: PowerLogic Power Meter, Class 3020." Dec. 1998 [retrieved on Dec. 6, 2011]. Retrieved from the Internet: <URL: http://www.powerlogic.com/literature/3020IM9503.pdf>. (70 pages).
International Search Report mailed Feb. 23, 2012 which issued in corresponding International Patent Application No. PCT/US2011/050129 (8 pages).
Written Opinion mailed Feb. 23, 2012 which issued in corresponding International Patent Application No. PCT/US2011/050129 (12 pages).

* cited by examiner

*Primary Examiner* — Tung X Nguyen

(57) ABSTRACT

An electrical power meter for monitoring electrical power supplied to a load comprises a meter case, a plurality of current transformers within the meter case for sensing the electrical current in a plurality of line conductors of a power distribution system, and a plurality of pairs of terminals on the meter case for connecting the meter to the line conductors. The terminals of each pair are located on opposite sides of one of the current transformers, and a current transformer bus bar connects the two terminals and extends through one of the current transformers. A plurality of guides adjacent selected pairs of the terminals position lugs connecting line conductors to the selected pairs of terminals.

4 Claims, 15 Drawing Sheets

COMPACT ELECTRICAL POWER METER

FIELD OF THE INVENTION

This invention is directed generally to electrical power meters for monitoring electrical power distribution systems by the use of sensors such as current transformers coupled to the distribution system.

BACKGROUND OF THE INVENTION

Power meters are commonly employed in electrical power distribution systems for monitoring parameters such as current, voltage and power delivered to one or more loads over a given time period.

SUMMARY

In one embodiment, an electrical power meter for monitoring electrical power supplied to a load comprises a meter case, a plurality of current transformers within the meter case for sensing the electrical current in a plurality of line conductors of a power distribution system, a plurality of pairs of terminals on the meter case for connecting the meter to the line conductors, each of the pairs of terminals being located on opposite sides of one of the current transformers, a plurality of current transformer bus bars each of which connects one of the pairs of terminals and extends through one of the current transformers, and a plurality of guides adjacent to at least selected pairs of the terminals for positioning lugs connecting the line conductors to the selected pairs of terminals. In one implementation, the guides are ribs formed as integral parts of the case, and the ribs have raised stops at opposite ends thereof for limiting movement of the lugs along the ribs. The current transformers includes a coil located inside said case, and the case may form apertures extending through the coils so that each of the bus bars can extend through one of the apertures.

In another embodiment, an electrical power meter for monitoring electrical power supplied to a load comprises a user interface that includes a display screen, a printed circuit board coupled to the display screen, and a meter case that includes a bezel framing the display screen, a back cover enclosing the printed circuit board and attached to the bezel and forming a compartment containing a plurality of terminals for connecting the meter to a plurality of power line conductors, a door hinged to a wall of the compartment for opening and closing the compartment to permit access to the terminals, and a label attached to the inside surface of the door and printed with at least one of wiring diagrams and installation instructions.

In a further embodiment, an electrical power meter for monitoring electrical power supplied to a load through load lines comprises a meter case, power metering circuitry within the case and adapted to be coupled to the load lines for monitoring the amount of electrical power transmitted through the load lines within prescribed time periods for billing purposes, a light port in the case and a photodetector positioned inside the case for detecting light directed into the port and coupled to the power metering circuitry for enabling adjustments to the power metering circuitry, and a movable cover for the light port, the cover being adapted to receive a security seal that prevents movement of the cover unless the seal is removed, so that the security seal must be removed to direct light into the port and thereby enable adjustments to the power metering circuitry.

In yet another embodiment, an electrical power meter for monitoring electrical power supplied to a load comprises a meter case that includes a first section housing a user interface and a second section housing current transformers and terminals for coupling the current transformers to conductors supplying electrical power to the load, and multiple fasteners formed as integral parts of the first and second sections for attaching the sections to each other and for attaching the user interface to the first section. In one implementation, the meter includes a printed circuit board containing power metering circuitry coupled to the current transformers for measuring the amount of electrical power supplied to the load within a prescribed time period, and the multiple fasteners include fasteners for attaching the printed circuit board to the meter case.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

The invention may best be understood by reference to the following description taken in conjunction with the accompanying drawings.

DETAILED DESCRIPTION OF THE ILLUSTRATED EMBODIMENTS

Although the invention will be described in connection with certain preferred embodiments, it will be understood that the invention is not limited to those particular embodiments. On the contrary, the invention is intended to include all alternatives, modifications and equivalent arrangements as may be included within the spirit and scope of the invention as defined by the appended claims.

Figure 1:
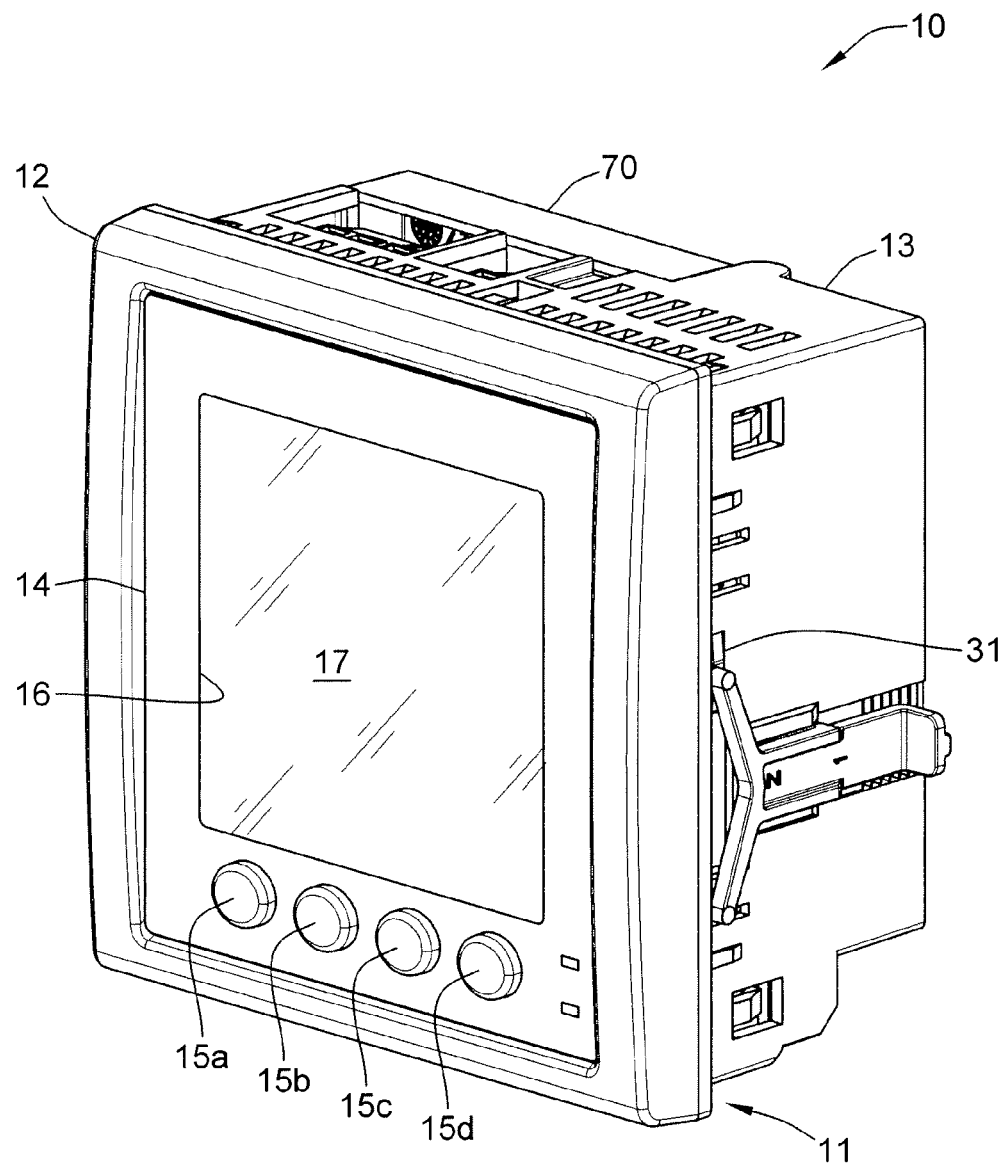
FIG. 1 is a front perspective view of a compact power meter.
Figure 3:
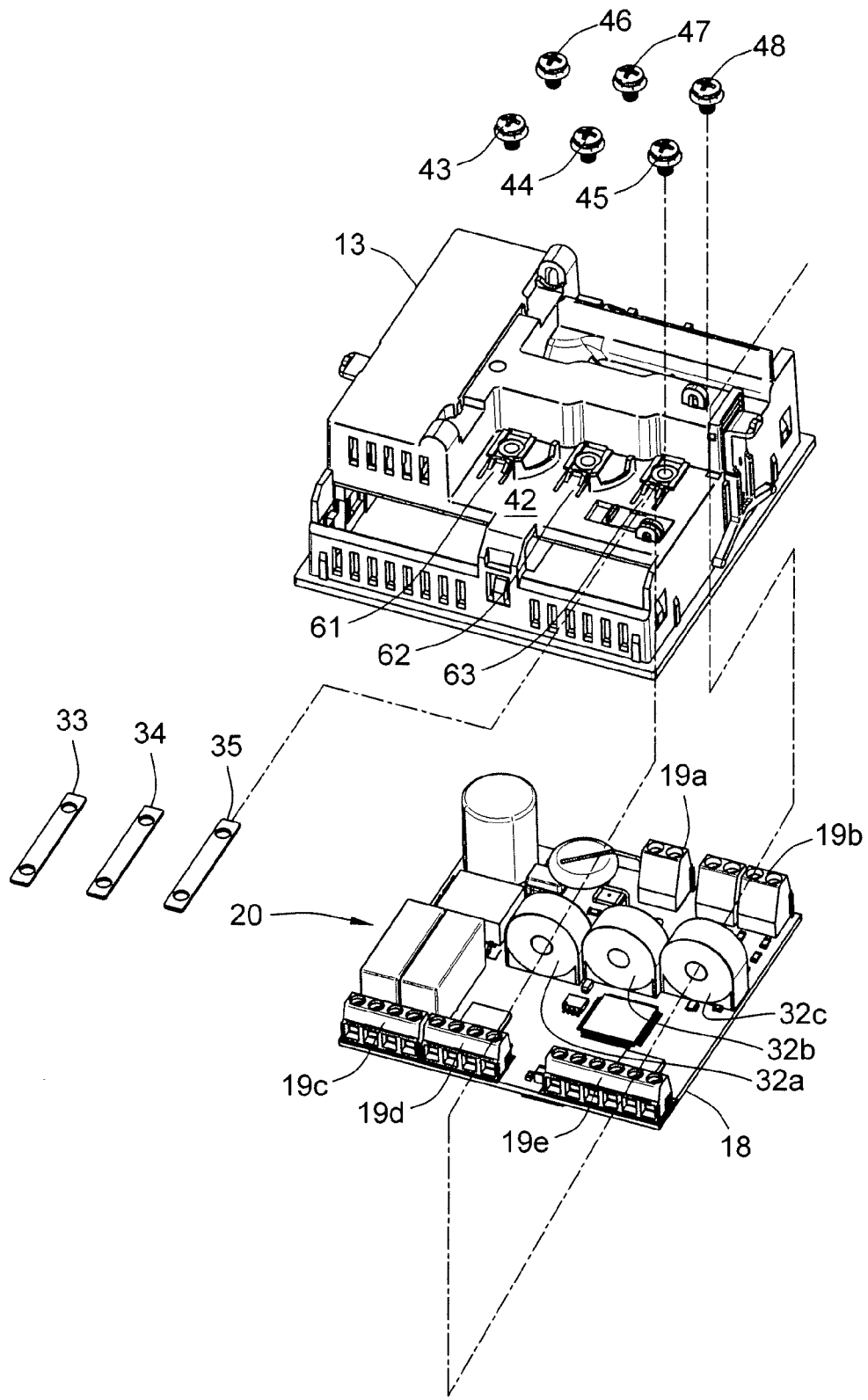
FIG. 3 is an exploded rear perspective view of a portion of the rear section of the case of the meter shown in FIG. 1, along with the printed circuit board inside the case and bus bars and terminal screws to be attached to the case and associated with current transformers on the printed circuit board.
Figure 4A:
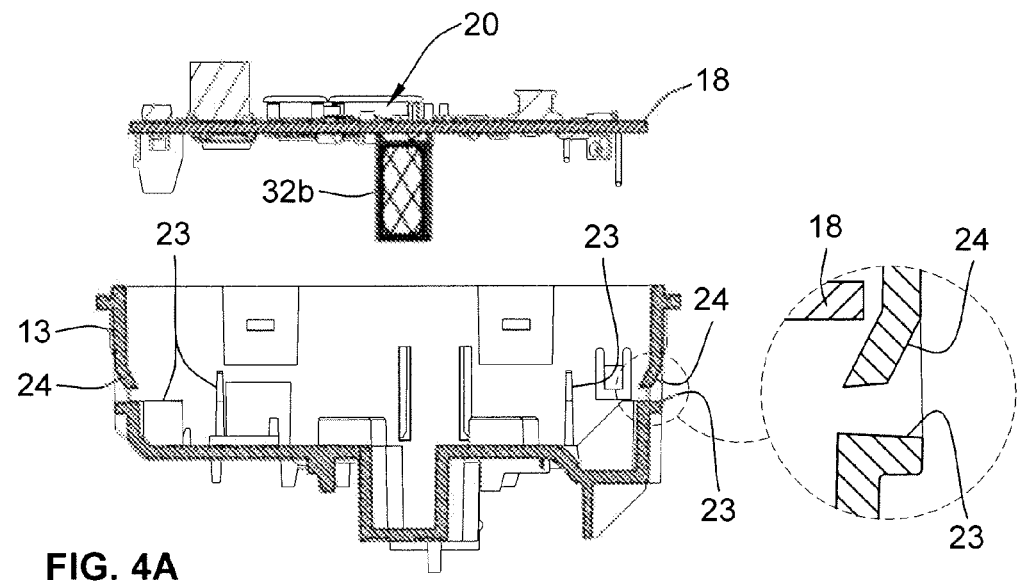
FIGS. 4A-4C are exploded sectional view of the rear section of the case of the meter shown in FIG. 1, along with the printed circuit board inside the case, in successive stages of assembly, with each figure including an enlargement of one of the fastening devices for latching the printed circuit board in its assembled position within the case.
Figure 4B:
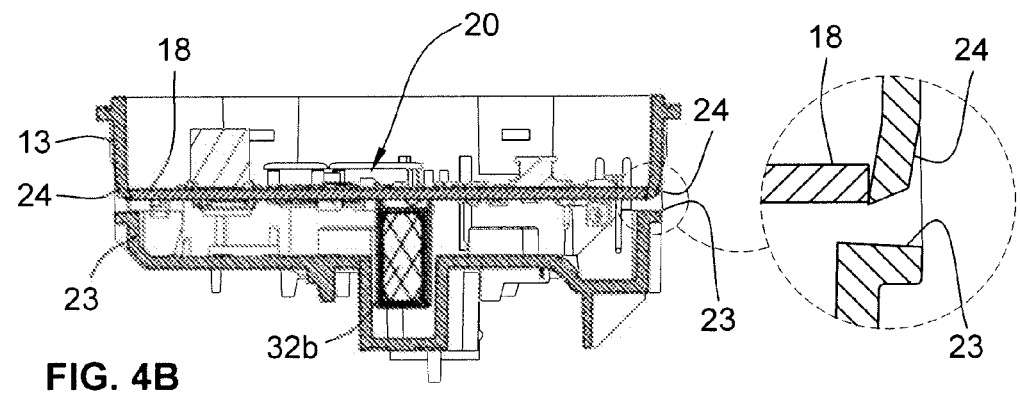
Figure 4C:
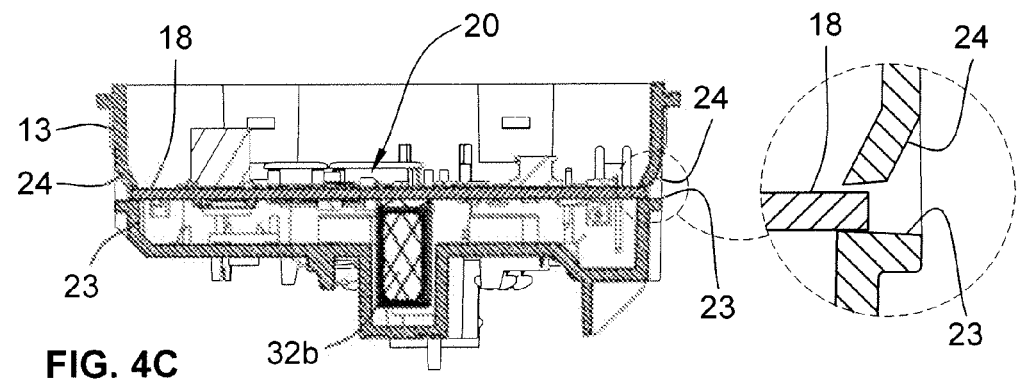
Figure 5A:
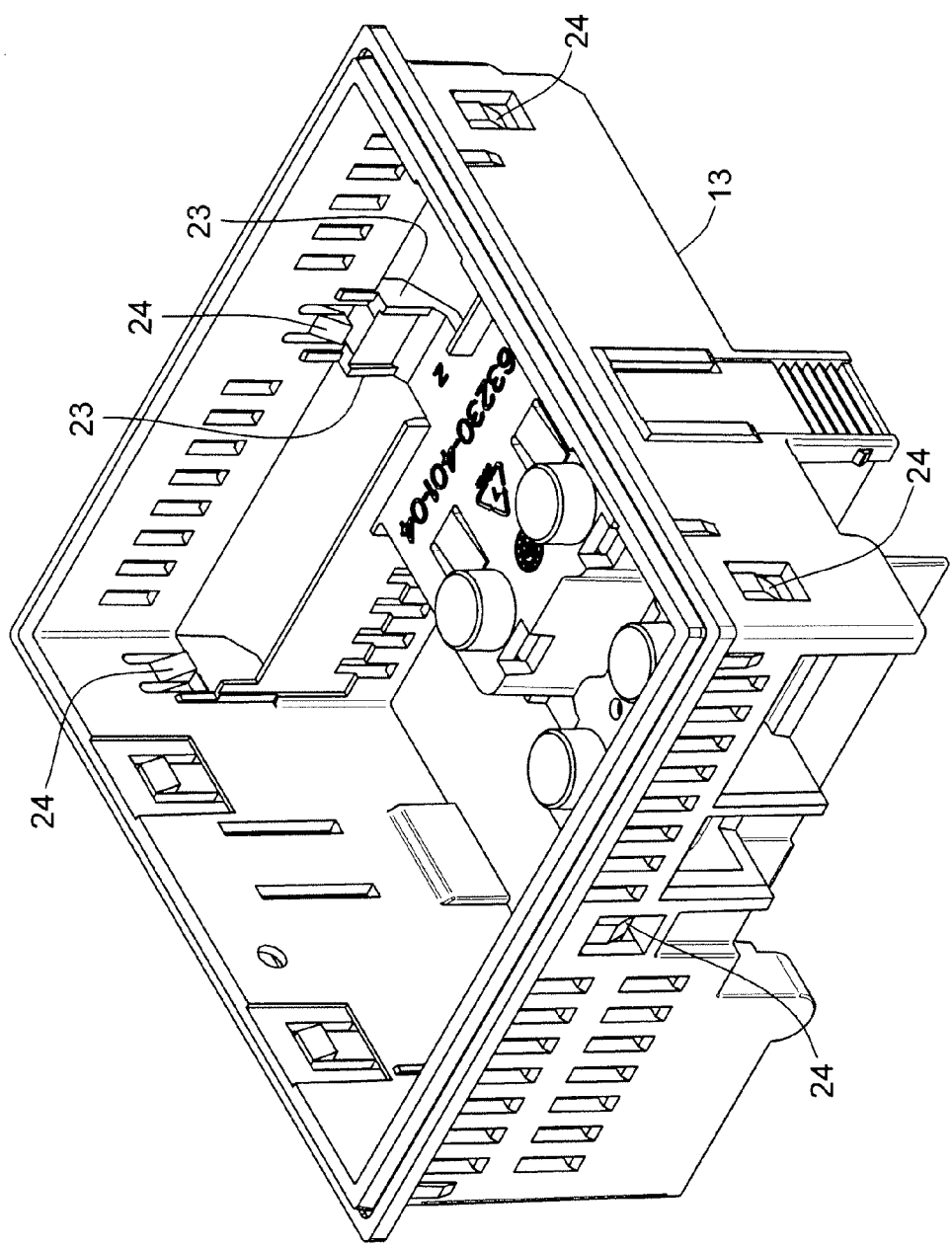
FIGS. 5A and 5B are enlarged front perspective views of the rear section of the case of the meter shown in FIG. 1, from opposite sides of case and without the printed circuit board.
Figure 5B:
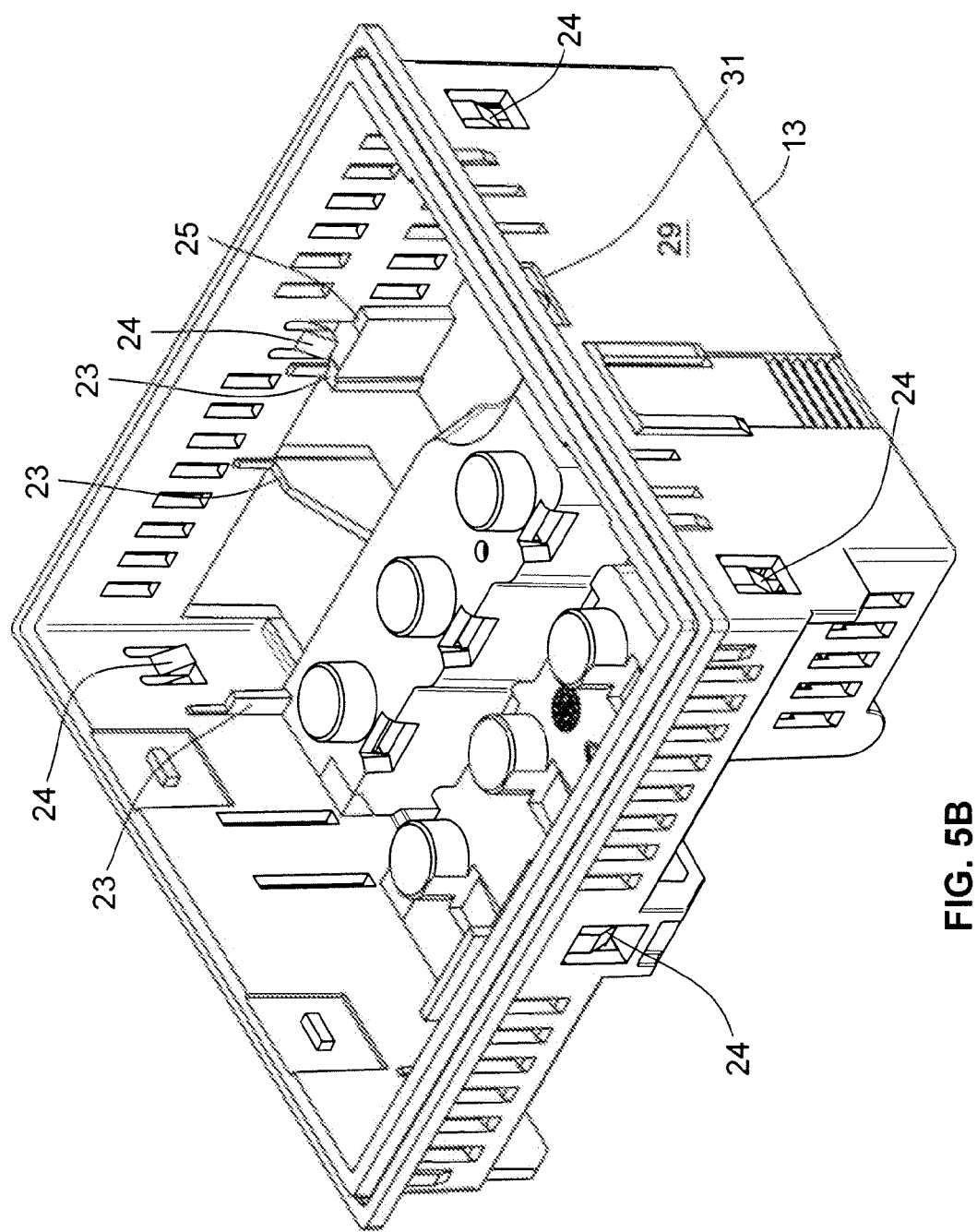

Referring to FIG. 1, a power meter 10 is housed in a case 11 formed by a front bezel 12 and a back cover 13 that snap together. The front bezel 12 is bonded to a user-interface panel 14 that contains four manually operable pushbuttons 15a-15d and a central window 16 for viewing a display 17, such as an LCD, attached to the bezel 12. Behind the display 17 is a printed circuit board 18 (see FIG. 3) that has multiple terminal blocks 19a-19e and associated circuitry 20 mounted on both sides of the board 18. The terminal blocks 19a and 19b are used to connect the circuitry 20 to a control power supply and voltage input lines, respectively. Terminal block 19c is used to connect digital outputs of the circuitry 20, such as demand sync signals, alarm signals or external control signals, to relays, motors, meters or other devices. Terminal block 19d is an RS485 port used for communicating with a monitoring and control system and can be daisy chained to multiple devices. Terminal block 19e is used to receive digital inputs for determining circuit breaker status, counting pulses, counting motor starts, accepting demand sync pulses or input metering.

In the illustrative embodiment, the terminal blocks 19a-19e and the circuitry 20 can be used to monitor either a single-phase or a three-phase electrical power distribution system. Typically the meter is used to measure currents and voltages and report in real time the rms values, which includes values for all three phases and neutral in the case of a three-phase power distribution system. The meter also typically calculates power factor, real power, reactive power and other desired parameters.

Figure 2A:
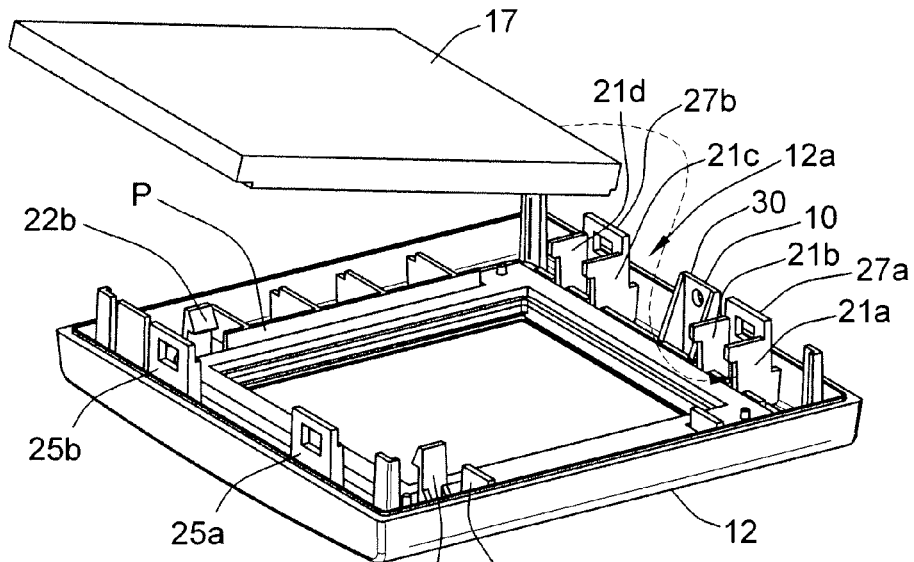
FIGS. 2A-2C are exploded perspective views of the display panel and bezel of the power meter of FIG. 1 in successive stages of assembly.
Figure 2B:
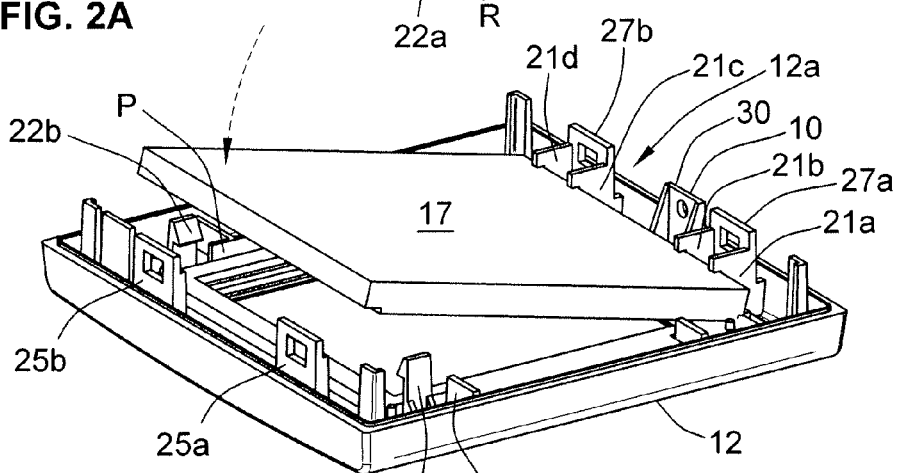
Figure 2C:
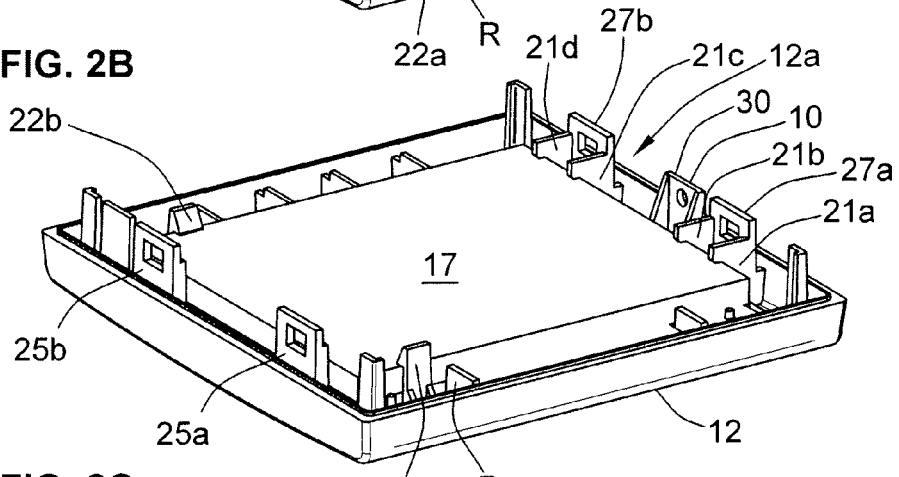

To facilitate assembly and to reduce the number of required parts, multiple fasteners formed as integral parts of the bezel 12 and the back cover 13 are used to attach the bezel 12, the back cover 13, the display 17 and the printed circuit board 18 to each other. As illustrated in FIGS. 2A-2C, the display 17 is attached to the bezel 12 by inserting the display 17 into a cavity 12a formed by the back side of the bezel 12, with one end of the display 17 fitting under flanges formed on the ends of four ribs 21a-21d extending rearwardly from the front wall of the bezel 12. The opposite end of the display 17 is then pushed toward the front of the bezel 12 until that end of the display snaps under a pair of flanges formed on the ends of a pair of resilient fingers 22a and 22b extending rearwardly from the front wall of the bezel 12 (see FIG. 2C). This securely attaches the display 17 to the bezel 12, with the display 17 being held in a centered position by the ribs 21a-21d and other positioning ribs R and a plate P formed as integral parts of the bezel.

Referring next to FIGS. 4A-4C and 5A-5B, the printed circuit board 18 is attached to the back cover 13 by inserting the board 18 into a front cavity formed by the back cover 13 so that the board 18 rests on supporting shoulders formed by multiple ribs 23 extending inwardly from the sidewalls of the back cover 13. To hold the printed circuit board 18 in place on the supporting shoulders, multiple resilient tabs 24 formed as integral parts of the back cover 13 overlap the front surface of the printed circuit board 18. As shown in the enlarged portions of FIGS. 4A-4C, the board 18 snaps under the resilient tabs 24 as the board is pressed down into the cavity of the back cover 13 and against the shoulders formed by the ribs 23 (see FIG. 4C). This securely latches the printed circuit board 18 to the back cover 13.

Figure 6A:
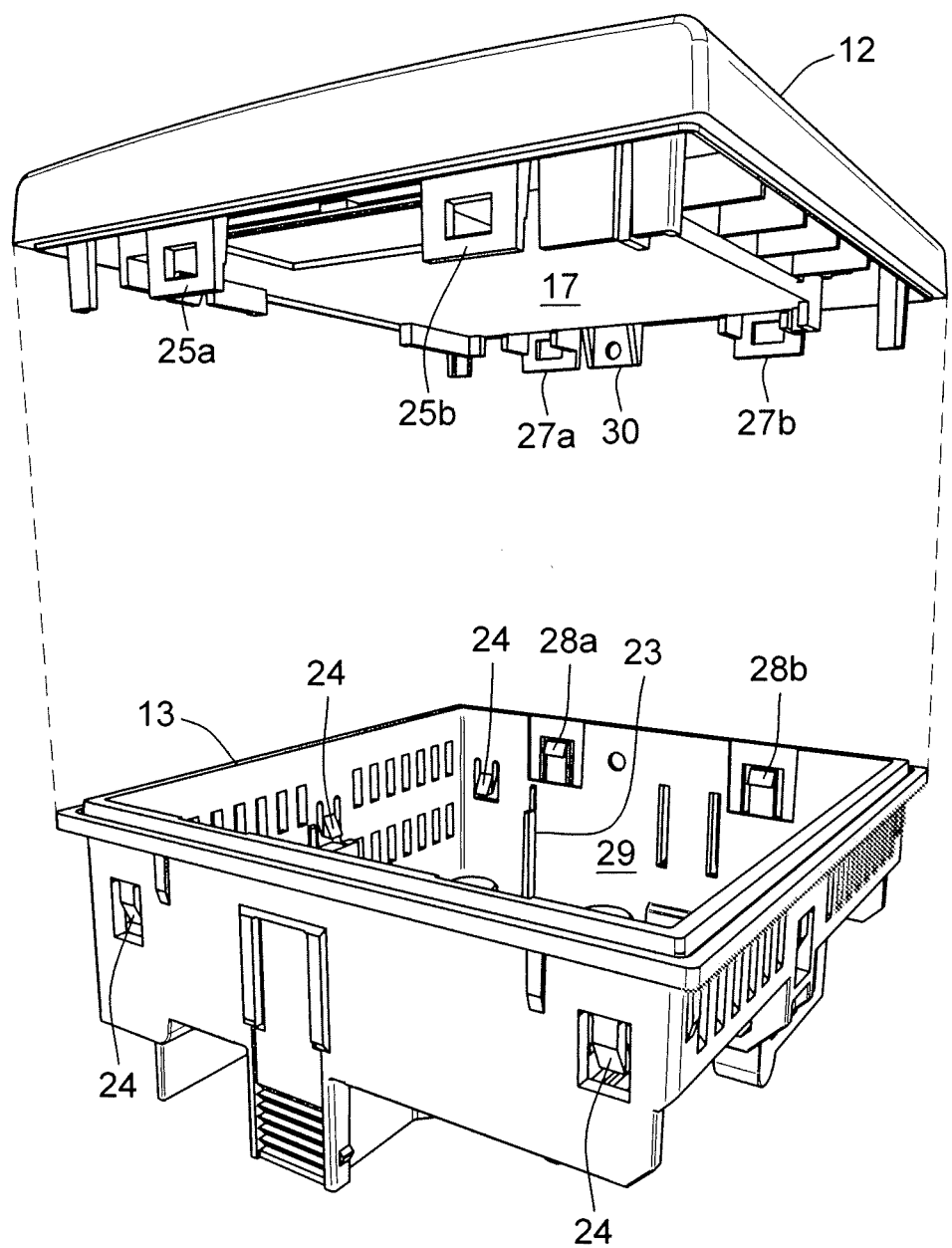
FIGS. 6A and 6B are exploded perspective views of the bezel, with the display panel installed, and the rear section of the case of the meter shown in FIG. 1, from opposite sides of case and without the printed circuit board.
Figure 6B:
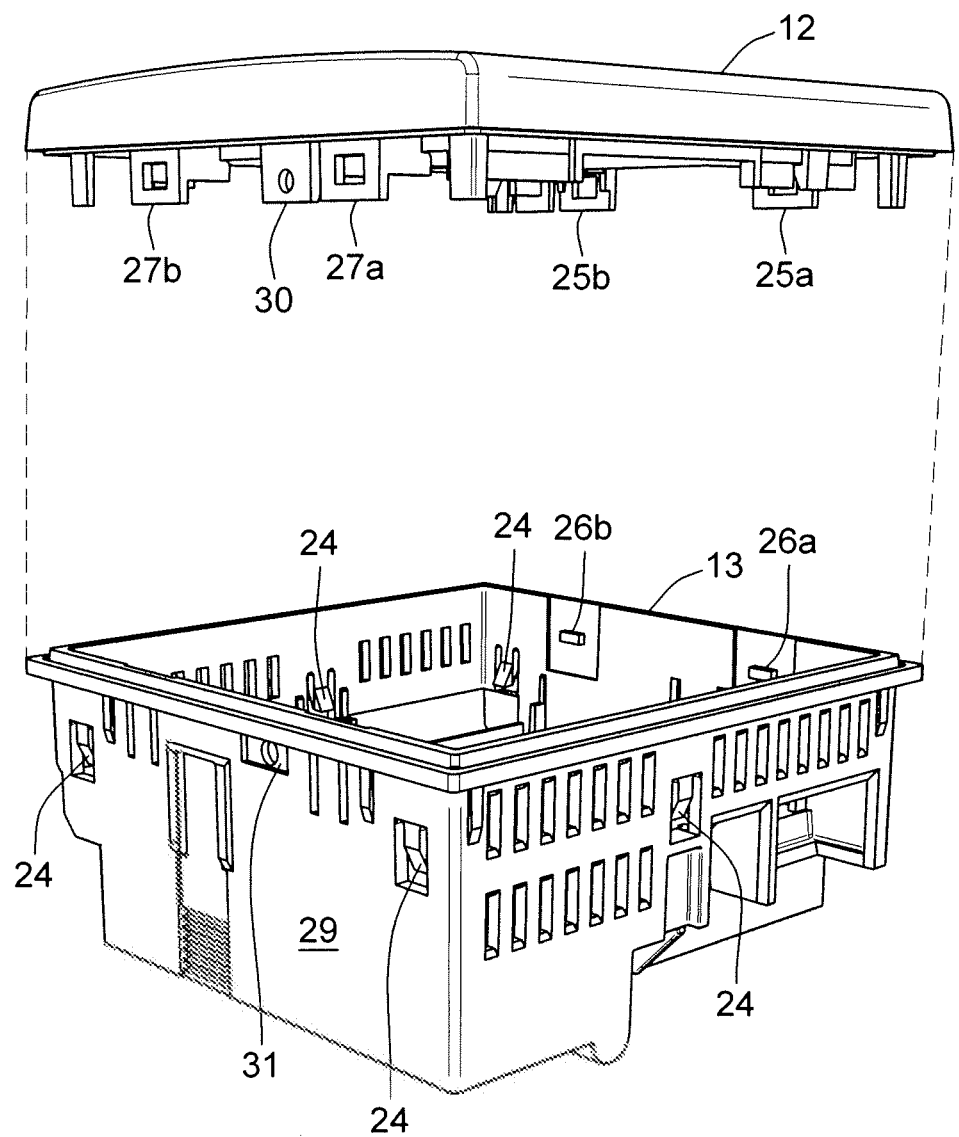

As shown in FIGS. 6A and 6B, the bezel 12 and the back cover 13 are attached to each other by inserting one end of the bezel 12 into the front cavity of the back cover 13 so that a pair of apertured tabs 25a and 25b fit over a pair of mating lugs 26a and 26b projecting from the inside surface of a sidewall of the back cover 13. Next, the opposite end of the bezel 12 is pressed into the front cavity of the back cover until a second pair of apertured tabs 27a and 27b snap under the flanges formed on the ends of a pair of resilient fingers 28a and 28b formed as integral parts of the back cover 13. This latches the bezel 12 securely to the back cover 13, with the display 17 and the printed circuit board 18 held securely in place in the cavity between the bezel 12 and the back cover 13.

To prevent tampering with the meter by attempts to detach the bezel 12 from the back cover 13, a plastic rivet is inserted through registered holes in one sidewall 29 of the back cover and an overlapping tab 30 extending rearwardly from the inside surface of the bezel 12, until the head of the rivet nests in a recess 31 in the outer surface of the back cover 13 (see FIGS. 6A and 6B). Any attempt to remove the plastic rivet will necessarily create visible evidence of tampering.

Figure 7:
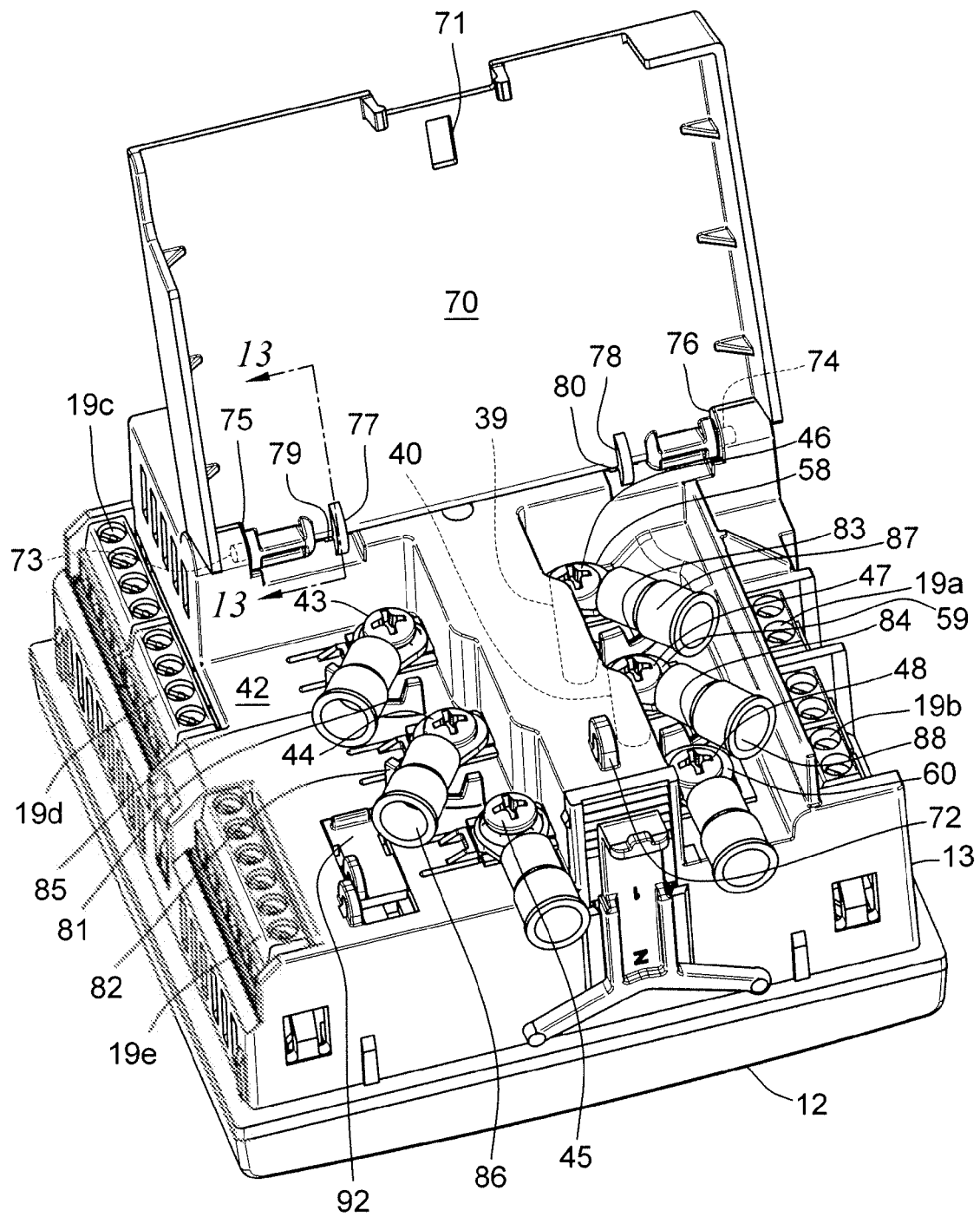
FIG. 7 is an enlarged rear perspective view of the rear section of the case of the meter shown in FIG. 1, with the bus bars shown in FIG. 3 fastened to terminals on the rear section of the case, and with a door on the rear section of the case in an open position.
Figure 10:
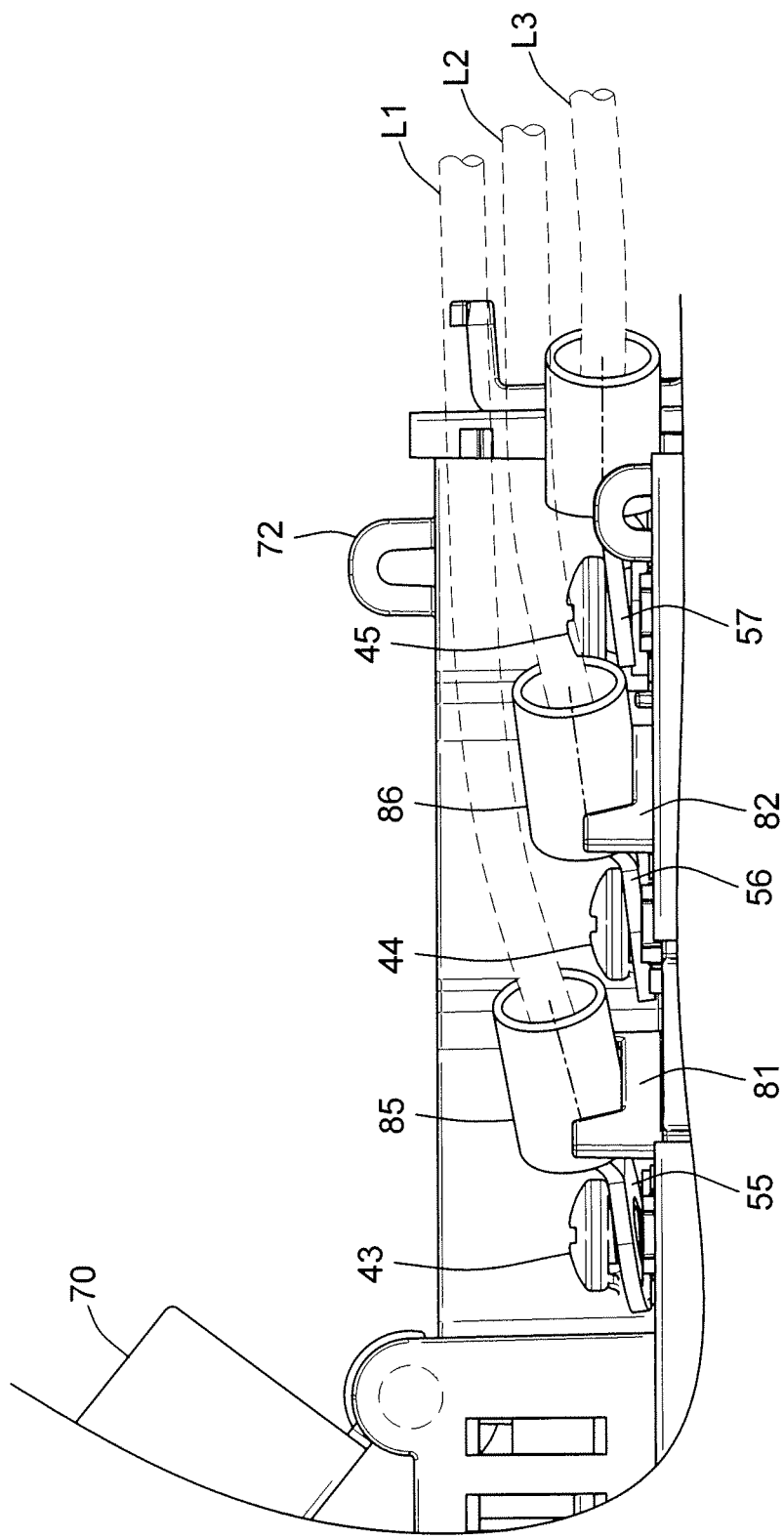
FIG. 10 is an enlarged side perspective of a portion of the rear section of the case shown in FIG. 3 with ring lugs attached to three of the terminals.
Figure 11:
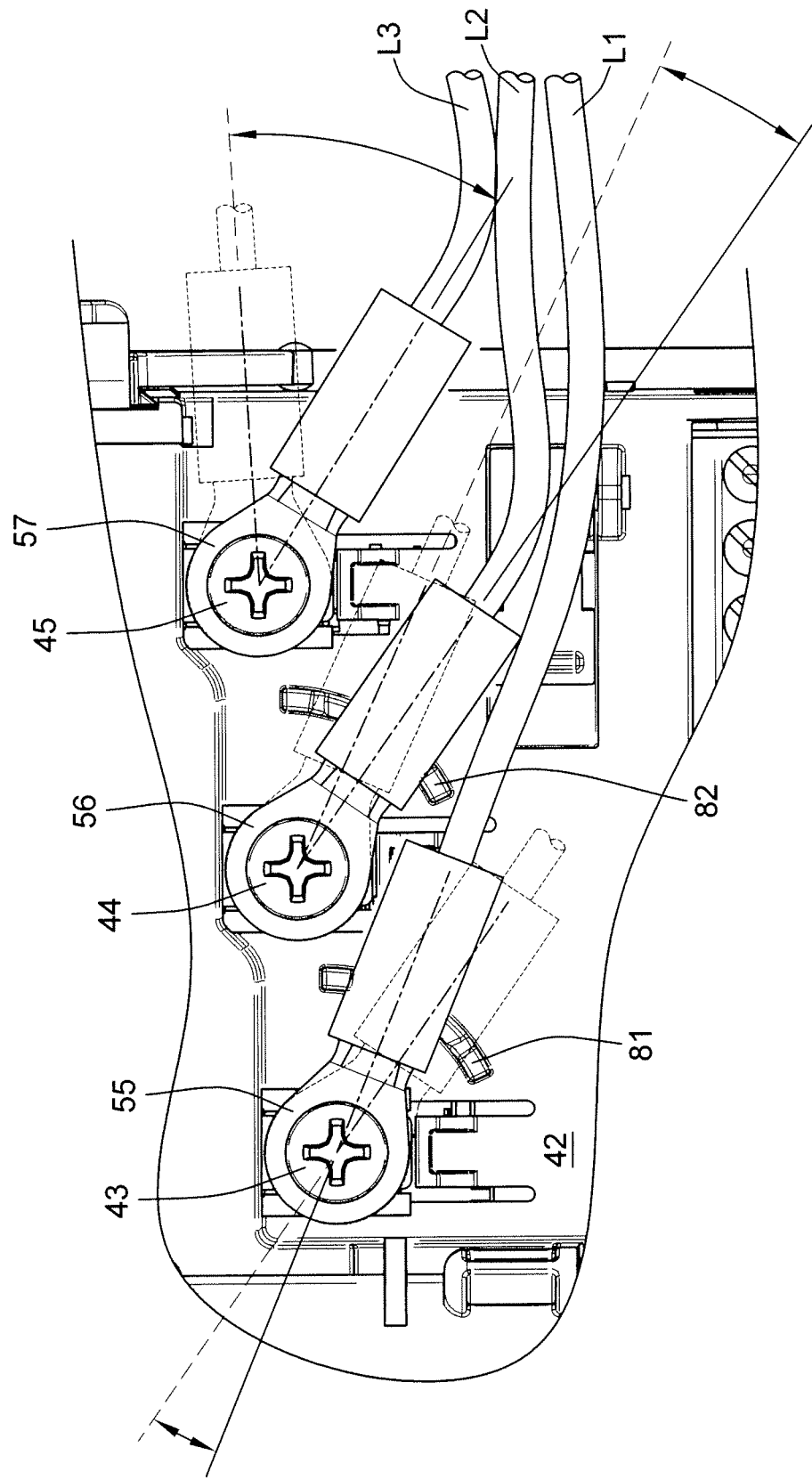
FIG. 11 is a rear elevation of the case section and ring lugs shown in FIG. 10.

The circuitry 20 on the printed circuit board 18 includes three current transformers 32a-32c (see FIGS. 3, 8 and 9), each of which is coupled to a different one of three conductors L1. L2 and L3 (see FIGS. 10 and 11) used to supply three-phase power to the load monitored by the meter 10. Each of the three conductors L1-L3 is connected in series with one of three bus bars 33-35 (see FIGS. 3, 8 and 9) connected to respective pairs of terminals 36, 39 and 37, 40 and 38, 41 (see FIGS. 3 and 7-11) embedded in the front wall 42 of a terminal compartment formed by the rear portion of the back cover 13. As can be seen in FIGS. 7-11, the terminals 36-41 include screws 43-48 that pass through holes in the bus bars 33-35 and thread into the embedded sockets of the respective terminals 36-41 for (1) securing ring lugs 55-60 used to connect the phase lines L1-L3 to the terminals and (2) attaching the three bus bars 33-35 to the respective pairs of terminals 36, 39 and 37, 40 and 38, 41, to conduct the current in each of the three phase lines through one of the bus bars. As can be seen in FIGS. 7, 10 and 11, the three terminals at each end of the bus bars, such as the terminals 36, 37 and 38, are offset from each other to enable the three lines L1-L3 to access their respective terminals in parallel with each other.

Each of the bus bars 33-35 also passes through one of the three current transformers 32a-32c (see FIGS. 8 and 9), so that each current transformer senses the current in a different one of the three phase lines L1-L3. Each of the three current transformers includes a coil located inside the case, which forms apertures aligned with the central openings of the respective coils to allow the respective bus bars to pass through the case and the central openings of the respective coils (see the coil of transformer 32c in FIG. 8 and transformer 32b in FIG. 9). The signals produced by the three current transformers 32a-32c, representing the magnitudes of the currents in the three phase lines, are typically sampled at regular intervals and used to compute the various parameters mentioned above.

To align the holes in the bus bars 33-35 with the terminals 36-41, the front wall 42 of the terminal compartment forms three channels 61-63 for receiving and positioning the respective bus bars 33-35. The three channels 61-63 are aligned with the apertures that provide access to the central openings of the respective coils within the back cover 13. A pair of slits formed in the wall 42 adjacent each of the channels 61-63 (as viewed in FIG. 8) permits that end of each channel to be flexible and resilient, so that it can be flexed downwardly to facilitate both insertion and removal of the respective bus bars 33-35.

Referring to FIG. 7, the terminal compartment is partially enclosed by a door 70 that is hinged to the rearmost wall of the back cover 13 and includes a slot 71 that fits over a loop 72 for receiving a lock (not shown) for securing the door 70. When unlocked, the door 70 can be opened to access the terminals 36-41 for connecting the three phase lines to the terminals. Labels can be attached to both the inside and outside surfaces of the door 70. For example, a label attached to the inside surface of the door may be printed with wiring diagrams and/or installation instructions, and a label attached to the outside surface of the door may be printed with information that meets standard labeling requirements for a power meter.

Figure 13:
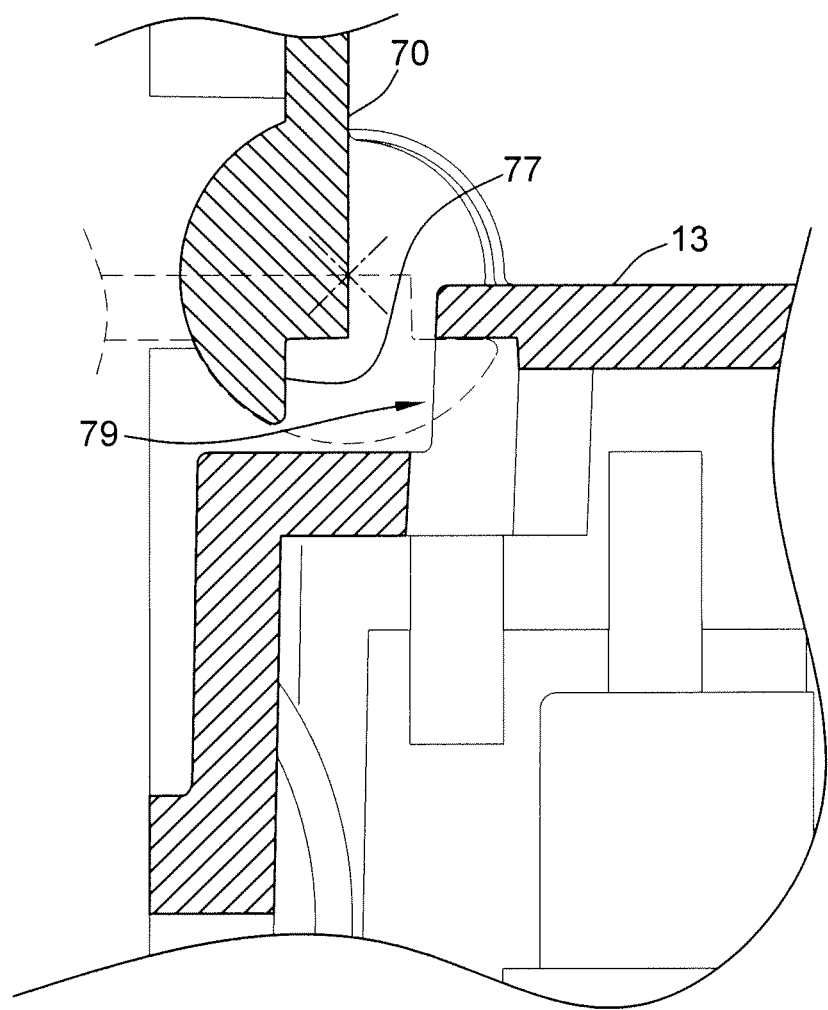
FIG. 13 is an enlarged section taken through one of the tabs on the hinged end of the door shown in FIG. 7.

Referring to FIG. 7, the door 70 includes a pair of integral pins 73 and 74 that fit into complementary recesses formed by integral sockets 75 and 76 in the back cover 13, to hinge the door 70 to the back cover 13. The door 70 also includes a pair of tabs 77 and 78 that are aligned with a pair of mating apertures 79 and 80 in the back cover 13. When the door 70 is in its closed position, the tabs 77 and 78 extend into the apertures 79 and 80 to make it more difficult to pry open the hinged end of the door. When the door 70 is open in a position where the door is orthogonal to the rear surface of the back cover 13, as depicted in FIG. 13, the tabs 77 and 78 are fully removed from the apertures 79 and 80 so that the door 70 can be installed (or detached) by simply flexing the door enough to remove one of the pins 73 or 74 from its socket. If an attempt is made to detach the door 70 when the tabs are at least partially within the apertures 79 and 80, some portion of the door will be damaged, which provides evidence of tampering.

As can be seen in FIGS. 7-11, the wall 42 of the back cover 13 includes protruding guide ridges 81-84 adjacent the four terminals 36, 37, 39 and 40, respectively, for positioning and limiting movement of the ring lugs 55, 56, 58 and 59 attached to the two phase lines connected to the four terminals 36, 37, 39 and 40. Specifically, the ridges 81-84 are positioned to engage the barrels 85-88 (see FIGS. 10 and 11) of the ring lugs 55, 56, 58 and 59 that are typically used to connect power conductors to the respective terminals 36, 37, 39 and 40. Because the guide ridges 81-84 extend outwardly from the wall that contains the terminal sockets 49-54, each ridge urges the barrel of the corresponding ring lug away from the case surface, as can be seen in FIG. 10. This presses the connecting ring of the lug tightly against the securing head of the terminal screw that fastens the ring lug to the terminal socket, thereby avoiding rotation of the ring lug as the terminal screw is tightened and retaining the lug, and thus the line conductor L, in the desired position. In the illustrative embodiment, the guide ridges 81-84 are formed as integral parts of the wall 42.

Figure 8:
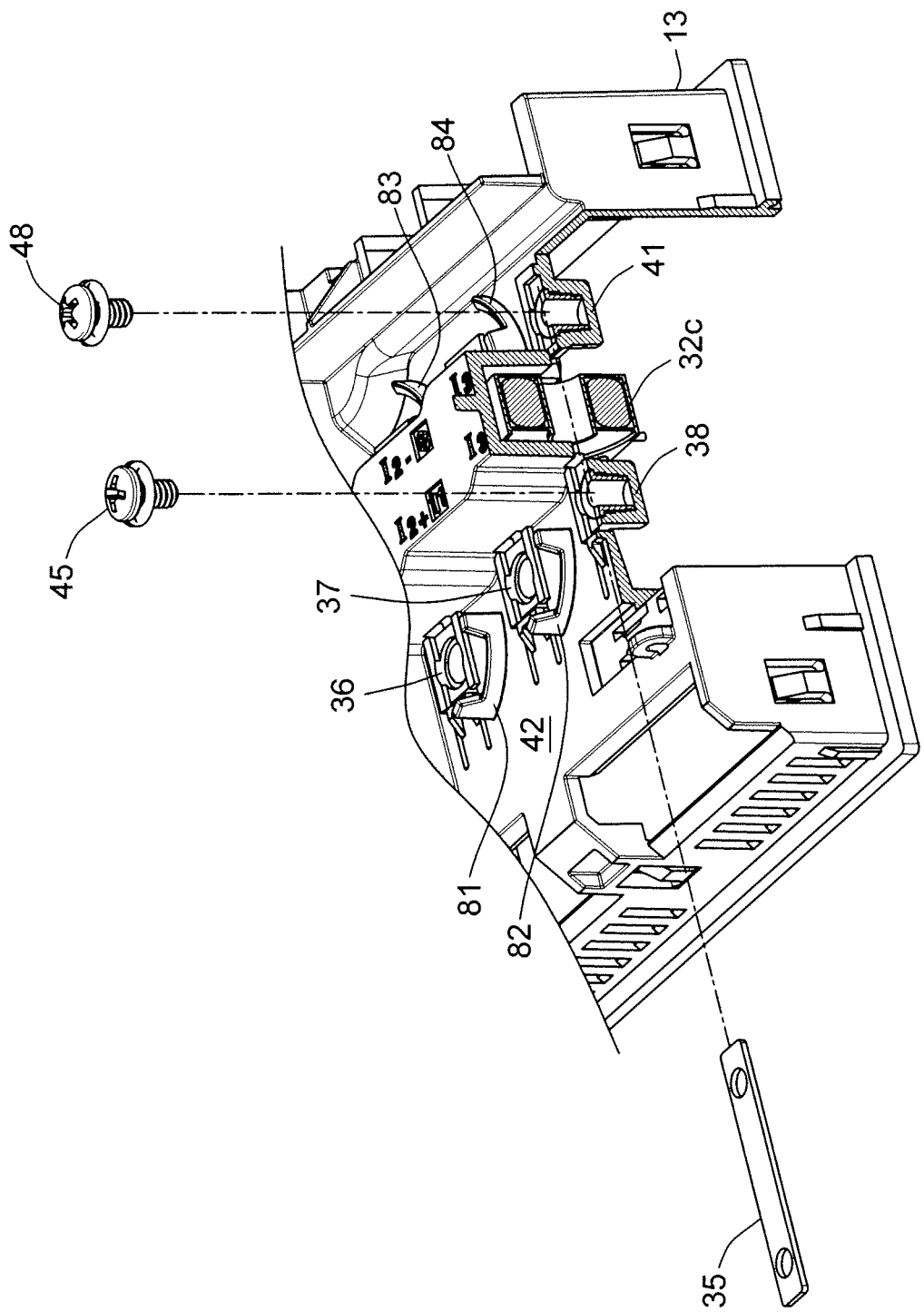
FIG. 8 is an enlarged exploded perspective view of a fragment of the rear section of the case shown in FIG. 3, along with one of the bus bars and two of the terminal screws to be attached to the case and associated with one of the current transformers inside the case, with a portion of the case and the current transformer sectioned to show the internal structure.
Figure 9:
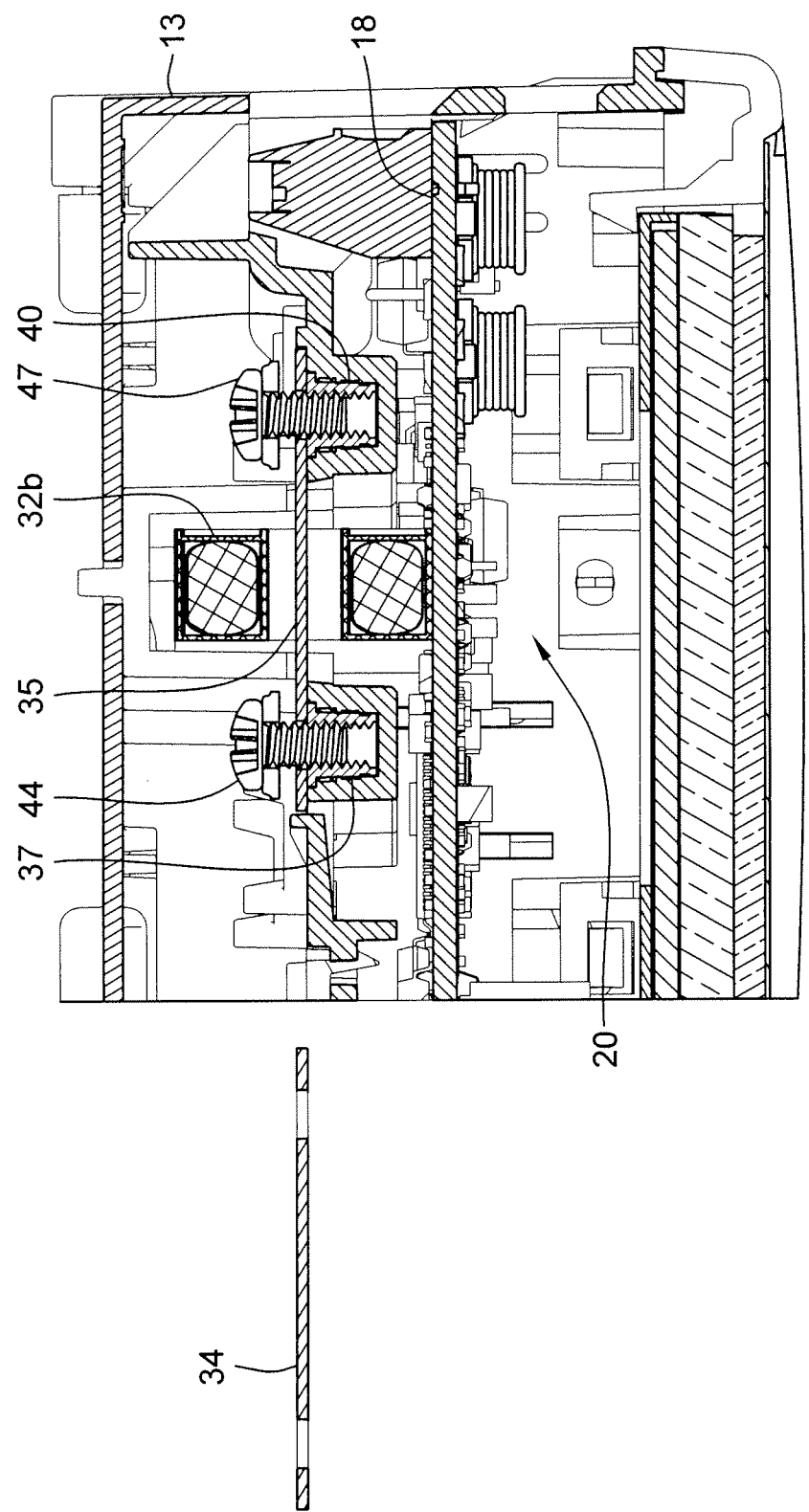
FIG. 9 is a further enlarged section of the assembled bezel, display panel, rear case section and printed circuit board, taken through the center of one of the current transformers.

Raised stops on opposite ends of each of the guide ridges 81-84 further limit any movement of a ring lug around the axis of the corresponding terminal screw, because considerable force is required to move a lug barrel over one of the raised stops. As can be seen in FIGS. 7 and 8, the ribs 83 and 84 have raised stops on only the inboard ends of the ridges because the outboard ends of the ridges 83 and 84 merge with the wall of the sockets that receive the terminal blocks 19a and 19b, which serves as a stop to limit movement of the ring lugs connected to the terminals that receive screws 46 and 47. The combined effect of the ridges 81-84 and the raised stops is to ensure that the six conductors attached to the six terminals 36-41 remain in the desired positions shown in FIGS. 10 and 11, where they do not interfere with each other, maintaining a space between each adjacent pair of conductors.

Figure 12A:
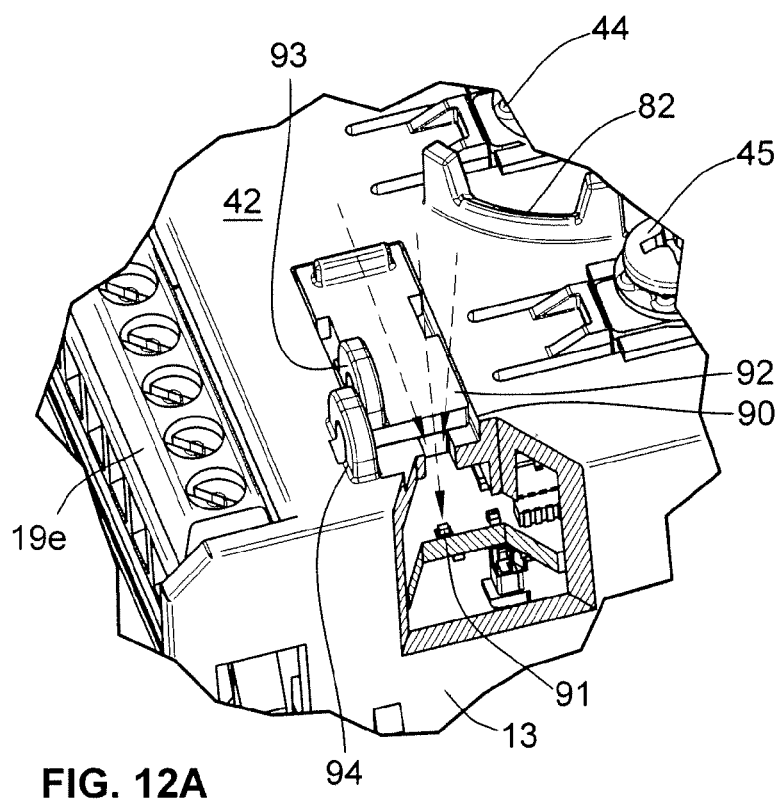
FIGS. 12A and 12B are enlarged perspective views of a portion of the rear section of the case shown in FIG. 3 that includes a port for communicating with an optical switch inside the case, with a movable slide in its open position in FIG. 12A and in its closed position in FIG. 12 B, and with a portion of the case sectioned to show the optical switch.
Figure 12B:
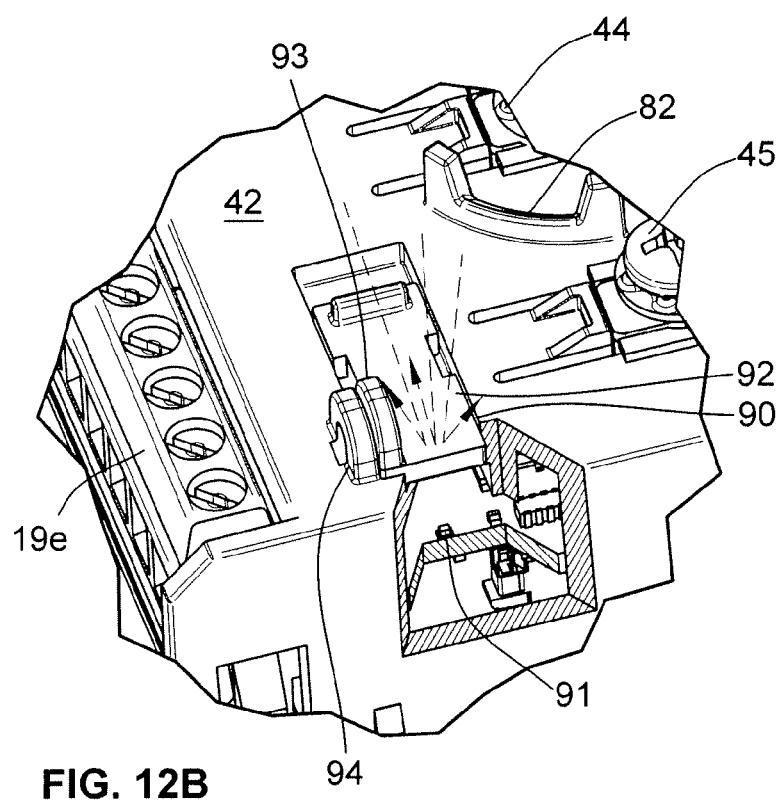

Turning next to FIGS. 12A and 12B, the wall 42 of the compartment that contains the terminals 36-41 also forms a port 90 that is aligned with a photodetector 91 on the printed circuit board 18 on the front side of the wall. The output signal of the photodetector 91 is coupled to the power metering circuitry 20 for enabling adjustments to be made to that circuitry, when the photodetector detects light directed into the port 90, e.g., by use of a flashlight. The port 90 is normally covered by a slide 92 that includes an integral loop 93 that registers with a mating loop 94 formed as an integral part of the wall 42, when the slide 92 is in the closed position shown in FIG. 12B. The registered openings in the loops 93 and 94 receive a security seal (not shown) that prevents movement of the slide 92 unless the seal is removed. Thus, the security seal must be removed before light can be directed into the port 90 to enable adjustments to be made to the power metering circuitry, which is used for billing for the amount of power delivered to the monitored load. This optical enabling/disabling feature is convenient because it avoids the need for the user to carry a key, and it is also safe because the user does not need to physically touch a switch that is potentially electrically sensitive or dangerous.

While particular embodiments, aspects, and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. An electrical power meter for monitoring electrical power supplied to a load, said meter comprising
   a meter case,
   a plurality of current transformers within said meter case for sensing the electrical current in a plurality of line conductors of a power distribution system, each of said current transformers having a hollow core extending along an axis,
   a plurality of pairs of terminals on said meter case for connecting the meter to said line conductors, each of said pairs of terminals being located on opposite sides of one of said current transformers,
   a plurality of current transformer bus bars each of which connects one of said pairs of terminals and extends through the hollow core of one of said current transformers,
   a plurality of lugs each of which is connected to one of said terminals, a plurality of line conductors connected to said lugs, all of said line conductors extending through the same single side of said case and transversely to the axes of said current transformers, and a plurality of guides adjacent at least selected pairs of said terminals for positioning said lugs connecting said line conductors to said selected pairs of terminals, said guides being oriented for guiding said lugs transversely to the axes of said current transformers and through said same single side of said case.

2. The electrical power meter of claim 1 in which said guides are ribs formed as integral parts of said case, said ribs having raised stops at opposite ends thereof for limiting movement of said lugs along said ribs.

3. The electrical power meter of claim 1 in which each of said current transformers includes a coil located inside said case, said case forms apertures extending through said coils, and each of said bus bars extends through one of said apertures.

4. The electrical power meter of claim 1 in which said case forms a terminal compartment, said terminals are located in said compartment, and said case includes a door providing access to said compartment and adapted to be sealed to control access to said compartment.

* * * * *